(12) United States Patent
Nakashiba et al.

(10) Patent No.: US 11,112,624 B2
(45) Date of Patent: Sep. 7, 2021

(54) SEMICONDUCTOR DEVICE AND MANUFACTURING METHOD THEREOF

(71) Applicant: RENESAS ELECTRONICS CORPORATION, Tokyo (JP)

(72) Inventors: Yasutaka Nakashiba, Tokyo (JP); Tohru Kawai, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 18 days.

(21) Appl. No.: 16/601,280

(22) Filed: Oct. 14, 2019

(65) Prior Publication Data
US 2021/0109383 A1   Apr. 15, 2021

(51) Int. Cl.
*G02F 1/025* (2006.01)
*H01L 23/48* (2006.01)
*G02F 1/225* (2006.01)
*G02B 6/12* (2006.01)

(52) U.S. Cl.
CPC ............ *G02F 1/025* (2013.01); *G02F 1/2257* (2013.01); *H01L 23/481* (2013.01); *G02B 2006/12142* (2013.01)

(58) Field of Classification Search
CPC .................. G02F 1/025; G02F 1/2257; G02B 2006/12142
See application file for complete search history.

(56) References Cited

U.S. PATENT DOCUMENTS

| 9,927,637 | B2 * | 3/2018 | Ogawa | G02F 1/2257 |
| 10,133,094 | B1 * | 11/2018 | Yu | G01J 1/0425 |
| 2004/0208454 | A1 | 10/2004 | Montgomery et al. | |
| 2010/0215309 | A1 * | 8/2010 | Shubin | G02F 1/01708 385/3 |
| 2017/0168326 | A1 * | 6/2017 | Ogawa | G02F 1/2257 |
| 2019/0113822 | A1 * | 4/2019 | Mekis | G02F 1/2257 |
| 2020/0081184 | A1 * | 3/2020 | Orcutt | G02F 1/025 |
| 2020/0133091 | A1 * | 4/2020 | Oh | G02B 6/1347 |

FOREIGN PATENT DOCUMENTS

JP   2006-515082 A   5/2006

* cited by examiner

*Primary Examiner* — Sung H Pak
(74) *Attorney, Agent, or Firm* — McDermott Will & Emery LLP

(57) ABSTRACT

A semiconductor device includes a first insulating layer, an optical waveguide, a first slab portion, a second insulating layer, and a conductive layer. The optical waveguide is formed on the first insulating layer and has a first side surface and a second side surface. The first slab portion is adjacent to the first side surface. The second insulating layer is formed on the optical waveguide. The conductive layer is formed on the second insulating layer. The optical waveguide has a first conductivity type. The first slab portion has first portion, second portion and third portion. The first portion has a second conductivity type opposite to the first conductivity type. The second portion is located farther from the optical waveguide than the first portion and has a first conductivity type. The third portion is formed between the optical waveguide and the second portion and has the first conductivity type.

14 Claims, 24 Drawing Sheets

SEMICONDUCTOR DEVICE AND MANUFACTURING METHOD THEREOF

BACKGROUND

It relates to semiconductor device and manufacturing method thereof, for example to semiconductor device including optical modulator and manufacturing method thereof.

THE BACKGROUND OF THE INVENTION

As an optical communication technique, a silicon photonics technique is known. The semiconductor device employing the silicon photonics art includes, for example, an optical modulator for changing the phase of light in an optical waveguide.

The optical modulator disclosed in Japanese Unexamined Patent Application Publication (Translation of PCT Application) No. 2006-515082 includes a first semiconductor layer (optical waveguide) having a first conductivity type, an insulating layer formed on the first semiconductor layer, a second semiconductor layer having a second conductivity type formed on the insulating layer, and transparent electrode formed on the second semiconductor layer. In the optical modulator, light travels substantially confined within the optical waveguide. A capacitance of the optical modulator is changed by applying a bias between the first semiconductor layer and the second semiconductor layer in the optical modulator. The phase of the light propagating inside the optical waveguide changes in accordance with the magnitude of the capacitance. As a result, the optical modulator can modulate the phase of light passing through the first semiconductor layer.

SUMMARY

However, when the optical modulator is operated, electron-hole pairs are thermally generated in the first semiconductor layer. The electron-hole pairs continue to be generated until a thermal equilibrium state is reached. During this time, the capacitance of optical modulator fluctuates. Since the modulation of the light is not performed properly until the thermal equilibrium state is reached, in the conventional optical modulator, it is preferable that the modulation of the light is performed after the thermal equilibrium state is reached. For this reason, the conventional semiconductor device may not be able to operate with high-speed operation. in the conventional semiconductor device, there is a room for improvement from the viewpoint of improving the characteristics of semiconductor device.

A problem of the present invention is improving of the characteristics of a semiconductor device. Other problems and novel features will become apparent from the description of the specification and drawings.

The semiconductor device according to embodiments includes a first insulating layer, an optical waveguide formed on the first insulating layer and having a first side surface and a second side surface positioned in opposite sides with each other, a first slab portion formed on the first insulating layer such that the first slab portion is adjacent to the first side surface, a second insulating layer formed on the optical waveguide, and a conductive layer formed on the second insulating layer. The optical waveguide has a first conductivity type. The first slab portion includes a first portion having a second conductivity type opposite to the first conductivity type, a second portion located farther from the optical waveguide than the first portion and having the first conductivity type, and a third portion formed between the optical waveguide and the second portion and having the first conductivity type.

A manufacturing method of a semiconductor device according to embodiments includes the steps of: (a) providing a semiconductor wafer having a first insulating layer and a semiconductor layer having a first conductivity type formed on the first insulating layer; (b) forming a second insulating layer on the semiconductor layer; (c) forming a conductive layer on the second insulating layer; (d) patterning the semiconductor layer, the second insulating layer, and the conductive layer to form an optical waveguide and a semiconductor portion which are formed with each other as a single member; and (e) implanting an impurity of a second conductivity type opposite to the first conductivity type into a portion of the semiconductor portion by an ion implantation method.

According to embodiments, the characteristics of the semiconductor device can be improved.

DETAILED DESCRIPTION

Figure 1:
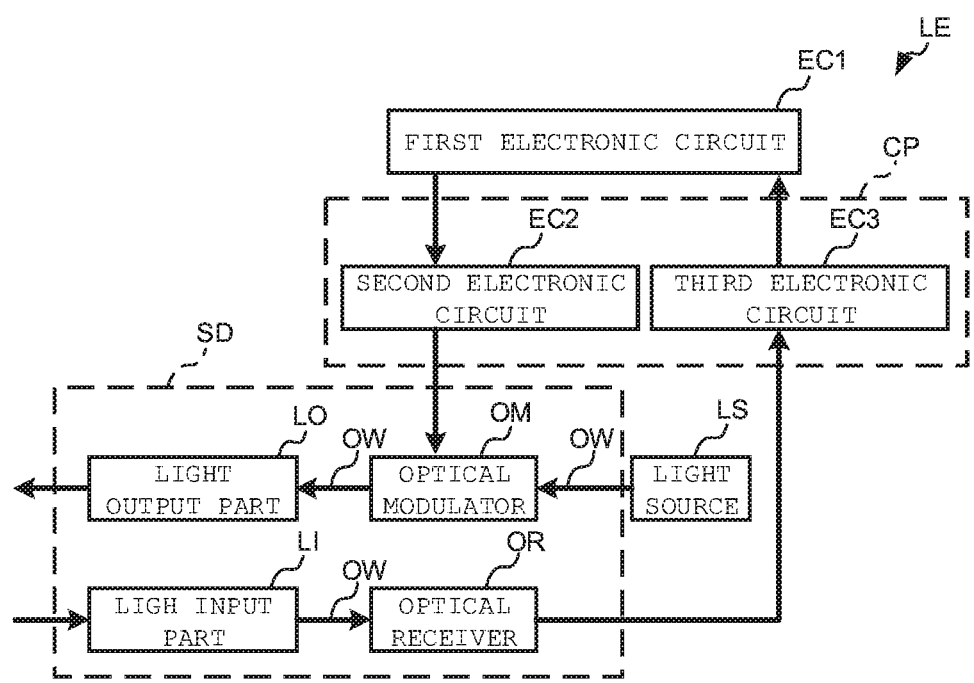
FIG. 1 is a block diagram showing an exemplary configuration of an optoelectronic hybrid device according to an embodiment.

Hereinafter, a semiconductor device according to an embodiment will be described in detail by referring to the drawings. In the specification and the drawings, the same or corresponding elements are denoted by the same reference numerals, and a repetitive description thereof is omitted. In the drawings, for convenience of description, the configuration may be omitted or simplified.

[Configuration of Optoelectronic Hybrid Device]

FIG. 1 is a block diagram showing an exemplary configuration of an optoelectronic hybrid device LE according to the embodiment.

As shown in FIG. 1, the optoelectronic hybrid device LE includes a first electronic circuit EC1, a light source LS, an IC chips CP and a semiconductor device SD. The semiconductor chip SCP includes a second electronic circuit EC2 and a third electronic circuit EC3. The semiconductor device SD includes an optical waveguide OW, an optical modulator OM, a light output part LO, a light input part LI and an optical receiver OR. The configuration of the semiconductor device SD will be described in detail later.

The first electronic circuit EC1 outputs an electrical signal (control signal) for control the second electronic circuit EC2. The first electronic circuit EC1 receives electrical signal outputted from the third electronic circuit EC3. The first electronic circuit EC1 is electrically coupled to the second electronic circuit EC2 and the third electronic circuit EC3. The first electronic circuit EC1 is formed of, for example, a known Central Processing Unit (CPU) or Field-Programmable Gate Array (FPGA) including a control circuit and a storage circuit.

The light source LS emits light. Examples of types of light sources LS include laser diode. A wavelength of the light emitted from the light source LS may be set as appropriate in accordance with the material constituting the optical waveguide OW as long as the emitted light can pass through the inside of the optical waveguide OW. For example, the peak wavelength of the light emitted from the light source LS is 1.0 μm or more and 1.6 μm or less. The light source LS is optically connected to the optical modulator OM via the optical waveguide OW.

The second electronic circuit EC2 outputs an electric signal (control signal) for controlling the operation of the optical modulator OM. More specifically, the second electronic circuit EC2 controls the optical modulator OM based on the control signal received from the first electronic circuit EC1. The second electronic circuit EC2 is electrically coupled to the optical modulator OM. The second electronic circuit EC2 is constituted by, for example, a well-known transceiver IC including a control circuit.

The optical modulator OM modulates the phase of the light emitted from the light source LS based on the electrical signal received from the second electronic circuit EC2. The optical modulator OM generates an optical signal including information included in the electrical signal. The type of the optical modulator OM is a Mach-Zehnder type optical modulator. The optical modulator OM may be an electrically controlled optical modulator, or a combined optical modulator using a combination of electrical control and thermal control. The optical modulator OM is optically connected to the optical output part LO via the optical waveguide OW.

The optical output part LO outputs the optical signal modulated by the optical modulator OM to the outside of the semiconductor device SD. For example, the optical output part LO emits an optical signal toward an external optical fiber. Examples of the type of the light output part LO include a grating coupler (GC) and a spot size converter (SSC).

The optical input part LI inputs external light into the semiconductor device SD. For example, optical signal emitted from external optical fiber is inputted into the semiconductor device SD. Examples of the type of optical input part LI include a grating coupler (GC) and a spot size converter (SSC). The optical input part LI is optically connected with the optical receiver OR via the optical waveguide OW.

The optical receiver OR generates electron-hole pairs based on the optical signal received from the optical input part LI. The optical receiver OR converts an optical signal into an electric signal. The optical receiver OR may have photoelectric conversion characteristics. Examples of the type of the optical receiver OR include an avalanche photodiode type optical receiver. The optical receiver OR is electrically coupled with the third electronic circuit EC3.

The third electronic circuit EC3 processes the electrical signal received from the optical receiver OR and outputs the processed electrical signal to the first electronic circuit EC1. More specifically, the third electronic circuit EC3 amplifies the electric signal received from the optical receiver OR and outputs the amplified electrical signal to the first electronic circuit EC1. The third electronic circuit EC3 is constituted by, for example, a known receiver IC including an amplifier circuit.

[Operation of Optoelectronic Hybrid Device]

Next, an operation example of the optoelectronic hybrid device LE according to the present embodiment will be described.

First, the transmission part of the optoelectronic hybrid device LE will be described. The light emitted from the light source LS reaches the optical modulator OM via the optical waveguide OW. The second electronic circuit EC2 outputs an electric signal for controlling the operation of the optical modulator OM to the optical modulator OM based on the control signal received from the first electronic circuit EC1. The optical modulator OM modulates light passing through the optical modulator OM. As a result, the electric signal is converted into an optical signal. The optical signal reaches the optical output part LO via the optical waveguide OW, and the optical signal is output to the outside of the semiconductor device SD in the light output unit LO. The optical signal emitted from the semiconductor device SD is guided to another optoelectronic hybrid device via optical fiber or the like.

Next, the receiving part of the optoelectronic hybrid device LE will be described. An optical signal guided from another optoelectronic hybrid device via optical fiber or the like reaches the light input part LI. The optical signal is guided to the inside of the optical waveguide OW in the light input part LI. The optical signal reaches the optical receiver OR via the optical waveguide OW, and is converted into an electric signal. The electric signal is processed by the third electronic circuit EC3 and then transmitted to the first electronic circuit EC1.

[Configuration of Semiconductor Device]

Figure 2:
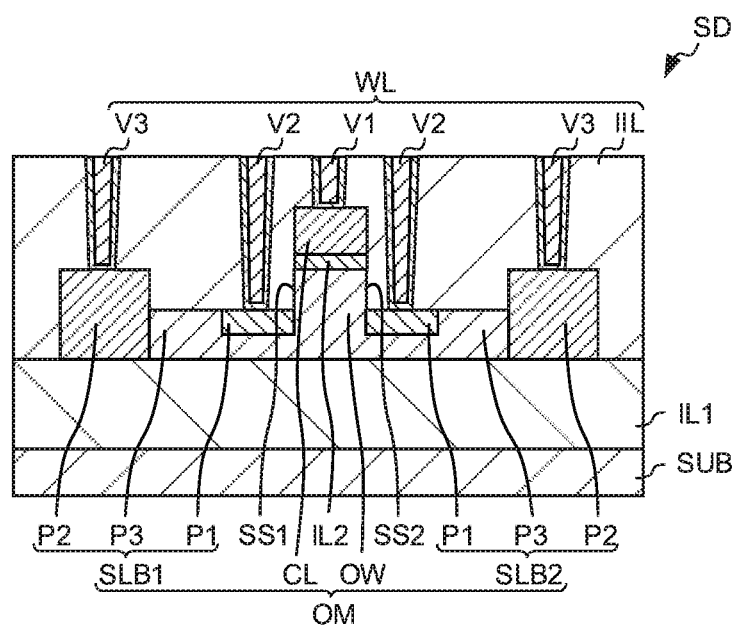
FIG. 2 is a cross-sectional view showing an exemplary configuration of a main portion of a semiconductor device according to the embodiment.

Next, the configuration of the semiconductor device SD according to the embodiment will be described. FIG. 2 is a cross-sectional view showing an exemplary configuration of the main portion of the semiconductor device SD.

As shown in FIG. 2, the semiconductor device SD includes a substrate SUB, a first insulating layer IL1, the optical modulator OM and a wiring layer WL. The wiring layer WL includes an interlayer insulating layer IIL, a first via V1, a second via V2, and a third via V3.

The substrate SUB supports the optical modulator OM via the first insulating layers IL1. Examples of types of substrate SUB include silicone substrate. The silicon substrate is, for example, a silicon single-crystal substrate containing impurities such as boron (B) and phosphorus (P). For example, the plane orientation of a main surface of the silicon substrate is (100), and the resistivity of the silicon substrate is 5 Ω·cm or more and 50 Ω·cm or less. A thickness of the substrate SUB is, for example, 100 μm or more and 900 μm or less.

The first insulating layer IL1 is formed on the substrate SUB. The first insulating layer IL1 is a cladding layer for substantially confining the light propagating inside the optical waveguide OW in the optical modulator OM to the inside of the optical waveguide OW. A material of the first insulating layer IL1 has a refractive index smaller than a refractive index of a material of the optical waveguide OW. Examples of material of the first insulating layer IL1 include silicon oxide ($SiO_2$). The refractive index of the material of the first insulating layer IL1 is, for example, 1.46. In this specification, the refractive index is a numerical value for light having a wavelength of 1.5 μm.

A thickness of the first insulating layer IL1 is preferably greater than a light seepage distance from the optical modulator OM. From the viewpoint of reducing stresses caused by the first insulating layer IL1 and from a viewpoint of suppressing sticking of the substrate SUB by the electrostatic chuck while manufacturing the semiconductor device SD, the thickness of the first insulating layer IL1 is preferably small. For example, the thickness of the first insulating layer IL1 is preferably 2 μm or more and 3 μm or less.

When the first insulating layer IL1 functions as a support layer, the semiconductor device SD may not include the substrate SUB. In this case, the first insulating IL1 is, for example, sapphire substrate.

The optical modulator OM is Mach-Zehnder type optical modulator. That is, the optical waveguide OW constituting the optical modulator OM includes an optical waveguide for input, a pair of optical waveguides branched from the optical waveguide for input, and an optical waveguide for output. The pair of optical waveguides is positioned between the optical waveguide for input and the output optical waveguide for output.

The optical modulator OM includes the optical waveguide OW, a first slab portion SLB1, a second slab portion SLB2, a second insulating layer IL2, and a conductive layer CL. The optical modulator OM is formed on the first insulating layer IL1. The optical modulator OM is configured to modulate the phase of the light propagating through the inside of the optical waveguide OW.

The optical waveguide OW is a path configured to allow the light to propagate inside the optical waveguide OW. The optical waveguide OW is a part of the optical modulator OM. The optical waveguide OW includes an upper surface and a lower surface located on opposite sides in the optical waveguide OW, and a first side surface SS1 and a second side surface SS2 located on opposite sides in the optical waveguide OW. The optical waveguide OW is formed on the insulating layer IL. The optical waveguide OW is directly or indirectly covered with the insulating layer IL and the interlayer insulating layer IIL. In present embodiment, the first side surface SS1 and the second side surface SS2 of the optical waveguide OW directly contact with the interlayer insulating layer IIL. The upper surface of the optical waveguide OW directly contacts with the second insulating layer IL2. The lower surface of the optical waveguide OW directly contacts with the first insulating layer IL1.

As described above, the optical waveguide OW is covered with the first insulating layer IL1 and the interlayer insulating layer IIL having a refractive index smaller than the refractive index of the material of the optical waveguide OW. Thus, the light can travel inside the optical waveguide OW while being substantially confined inside the optical waveguide OW. However, the light travels inside the optical waveguide OW while seeping out to the outside of the optical waveguide OW by the wavelength order of the light.

The cross-sectional shape of the optical waveguide OW in the cross-section orthogonal to the extending direction of the optical waveguide OW may be any shape as long as light can propagate inside the optical waveguide OW. Examples of the cross-sectional shape of the optical waveguide OW include a rectangular shape and a trapezoidal shape. In present embodiment, the cross-sectional shape of the optical waveguide OW is a rectangular shape.

The width and height (thickness) of the optical waveguide OW may be any size as long as the optical waveguide OW can appropriately propagate inside the optical waveguide OW. The width and height of the optical waveguide OW can be appropriately set in accordance with conditions such as the wavelength of light passing through the inside of the optical waveguide OW and a mode of the light. The width of the optical waveguide OW is, for example, 300 nm or more and 500 nm or less. The height of the optical waveguide OW is, for example, 200 nm or more and 300 nm or less.

The width of the optical waveguide OW is a distance between the first side surface SS1 and the second side surface SS2, and is the length of the optical waveguide OW in the opposite direction/facing direction of the first side surface SS1 and the second side surface SS2, for example, the width direction of the optical waveguide OW. The height of the optical waveguide OW is a distance between the lower surface of the optical waveguide OW and the upper surface of the optical waveguide OW in the opposite direction of the upper surface and the lower surface of the optical waveguide OW. In present embodiment, the height of the optical waveguide OW is a distance between the upper surface of the insulating layer IL and the upper surface of the optical waveguide OW in facing direction of the upper surface and lower surfaces of the optical waveguide OW.

The material of the optical waveguide OW is a semiconductor material transparent to light passing through the inside of the optical waveguide OW. Examples of the material for the optical waveguide OW include silicon and germanium. The crystal structure of the material of optical waveguide OW may be single crystal or polycrystalline. The refractive index of the material of the optical waveguide OW is, for example, 3.5.

The optical waveguide OW contains an impurity of a first conductivity type. The first conductivity type may be an n-type or a p-type. When the first conductivity type is n-type, the optical waveguide OW contains n-type impurity such as arsenic (As) and phosphorus (P). When the first conductivity type is p-type, the second semiconductor layer SL2 contains p-type impurity such as boron (B) and boron difluoride (BF2). From a viewpoint of suppressing from scattering light propagating through the optical waveguide OW by the impurities included in the optical waveguide OW, the impurity concentration of the optical waveguide OW is preferably, for example, $1 \times 10^{17}$ cm$^{-3}$ or less, more preferably about $1 \times 10^{16}$ cm$^{-3}$.

The first slab portion SLB1 is formed on the first insulating layer IL1 such that the first slab portion SLB1 is adjacent the first side surface SS1 of the optical waveguide OW in the width direction of the optical waveguide OW. The first slab portion SLB1 is formed with the optical waveguide OW as a single member. The height (thickness) of the first slab portion SLB1 is preferably smaller than the height (thickness) of the optical waveguide OW from a viewpoint of appropriately confining light inside the optical waveguide OW. The height of the first slab SLB1 is preferably about 100 nm.

The second slab portion SLB2 is formed on the first insulating layer IL1 such that the second slab portion SLB2 adjoins the second side surface SS2 of the optical waveguide OW in the width direction of the optical waveguide OW. The second slab SLB2 is formed with the optical waveguide OW as a single member. The height (thickness) of the second slab portion SLB2 is the same as that of the first slab portion SLB1.

In present embodiment, the first slab portion SLB1 includes a first portion P1, a second portion P2 and a third portion P3. The second slab portion SLB2 also includes a first portion P1 (a fourth portion), a second portion P2 (a fifth portion) and a third portion P3 (a sixth part). The first portion P1, the second portion P2 and the third portion P3 are formed with each other as a single member.

The first portion P1 has a second conductivity type opposite to the first conductivity type of the optical waveguide OW. From a viewpoint of enhancing the conductivity of the first portion P1, it is preferable that the impurity concentration of the first portion P1 is great. From a viewpoint of suppressing the light seeping out of the optical waveguide OW from being scattered by the impurities contained in the first portion P1, the impurity concentration of the first portion P1 is preferably small. The impurity concentration of the first portion P1 is appropriately adjusted in accordance with the distance between the first portion P1 and the optical waveguide OW. For example, the impurity concentration of the first portion P1 is preferably $1 \times 10^{18}$ cm$^{-3}$ or more and $1 \times 10^{20}$ cm$^{-3}$ or less. From a viewpoint of achieving both the conductivity improvement and the light-scattering suppression, it is preferable that the impurity concentration of a contact portion contacting with the second via V2 in the first portion P1 is greater than the impurity concentration of the other portion in the first portion P1. For example, the first portion P1 may have a high concentration region directly contacting the second via V2 and a low concentration region formed such that the low concentration region surrounds the high concentration region. The impurity concentration of the high concentration regions is preferably $1 \times 10^{19}$ cm$^{-3}$ or more, more preferably about $1 \times 10^{20}$ cm$^{-3}$. The impurity concentration of the low concentration regions is preferably less than $1 \times 10^{19}$ cm$^{-3}$, more preferably about $1 \times 10^{18}$ cm$^{-3}$. The contact portion may be silicided.

As will be described in detail later, part of the charges generated in the optical waveguide OW reach the first portion P1. From a viewpoint of facilitating the charges to reach the first portion P1, it is preferable that the first portion P1 is located close to the optical waveguide OW. It is preferable that the first portion P1 is located closer to the optical waveguide than the second portion P2 in the first slab portion SLB1 (the second slab portion SLB2). The first portion P1 is preferably closer to the optical waveguide OW than the second portion P2. Preferably, the first portion P1 contacts with the first side surface SS1 (second side surface SS2) of the optical waveguide OW.

The first portion P1 contacts with the upper surface of the first slab portion SLB1. The first portion P1 may extend continuously along the optical waveguide OW in plan view. The number of the first portion P1 formed on each of the first slab portion SLB1 and the second slab portion SLB2 may be plural. In this instance, the plurality of first portion P1 are spaced apart from each other and intermittently arranged along the optical waveguide OW in plan view.

The second portion P2 is located farther from the optical waveguide OW than the first portion P1. The height of the second portion P2 is not particularly limited. The height of the via V2 on the second portion P2 can be adjusted according to the height of the second portion P2. A distance between an upper surface of the second portion P2 and the upper surface of the first insulating layer IL1 may be the same as or different from a distance between an upper surface of the first portion P1 and the upper surface of the first insulating layer IL'. In present embodiment, the second portion P2 protrudes away from the upper surface of the first insulating layer IL'. The distance between the upper surface of the second portion P2 and the upper surface of the first insulating layer IL1 is greater than the distance between the upper surface of the first portion P1 and the upper surface of the first insulating layer IL'. The distance between the upper surface of the second portion P2 and the upper surface of the first insulating layer IL1 is approximately the same as the height of the optical waveguide OW.

The second portion P2 has the first conductivity type. From a viewpoint of suppressing the voltage drop in the second portion P2 and from a viewpoint of forming an ohmic junction between the second via V2 and the second portion P2, it is preferable that the impurity concentration of the second portion P2 is greater than the impurity concentration of the optical waveguide OW. The impurity concentration of the second portion P2 is preferably, for example, $1 \times 10^{19}$ cm$^{-3}$ or more, and more preferably, the impurity concentration is about $1 \times 10^{20}$ cm$^{-3}$.

The third portion P3 is formed between the optical waveguide OW and the second portion P2. In present embodiment, the third portion P3 contacts with a lower surface and a side surface of the first portion P1. The third portion P3 is a portion other than the first portion P1 and the second portion P2 in the first slab portion SLB1 (the second slab portion SLB2). The third portion P3 has the first conductivity type. The impurity concentration of the third portion P3 is preferably, for example, $1\times10^{17}$ cm$^{-3}$ or less, and more preferably, about $1\times10^{16}$ cm$^{-3}$.

The second insulating layer IL2 is formed on the optical waveguide OW. Preferably, the second insulating layer IL2 directly contacts with the upper surface of the optical waveguide OW. The second insulating layer IL2 electrically insulates the optical waveguide OW and the conductive layer CL. A thickness of the second insulating layer IL2 is, for example, 10 nm or more and 30 nm or less. The second insulating layer IL2 is made of, for example, silicon oxide (SiO$_2$).

The conductive layer CL is formed on the second insulating layer IL2. The conductive layer CL preferably directly contacts with an upper surface of the second insulating layer IL2. The conductive layer CL constitutes an electrode of the optical modulator OM.

The conductive layer CL has the first conductivity type. The conductive layer CL is, for example, a semiconductor layer containing an n-type impurity or a p-type impurity. It is preferable that the impurity concentration in the conductive layer CL is $1\times10^{17}$ cm$^{-3}$ or more. Examples of a material of the conductive layer CL is, for example, polycrystalline silicon.

The wiring layer WL is formed on the first insulating layer IL1 such that the wiring layer WL covers the optical modulator OM. The wiring layer WL is a layer composed of one or more wiring layers. The wiring layer is a layer including an interlayer insulating layer and one or both of a wiring and a via that are formed in the interlayer insulating layer. The via is a conductive member that electrically connects two wiring formed in layers that differ from each other. For example, "wiring" is a metallic layer configured to allow an electrical signal to be transmitted therein.

The wiring layer WL includes an interlayer insulating layer IIL, a first via V1, a second via V2, and a third via V3.

The interlayer insulating layer IIL is formed on the first insulating layer IL1 such that the interlayer insulating layer IIL covers the optical waveguide OW, the first slab portion SLB1, the second insulating layer IL2, and the conductive layer CL. The interlayer insulating layer IIL is formed of a material having a refractive index smaller than that of the material of the optical waveguide OW. Examples of material for the interlayer insulating layer IIL include silicon oxide (SiO$_2$). The refractive index of the material of the interlayer insulating layer IIL is, for example, 1.46. The thickness of the interlayer insulating layer IIL is preferably 1.0 µm or more from a viewpoint of suppressing scattering of light seeping out of the optical waveguide OW by the first wiring formed on the interlayer insulating layer IIL. Further, from a viewpoint of easiness of the manufacturing process, the thickness of the interlayer insulating layer IIL is preferably 2 µm or less.

The first via V1 is formed in the interlayer insulating layer IIL such that the first via V1 reaches the conductive layer CL. In the thickness direction of the interlayer insulating layer IIL, a length of the first via V1 is smaller than a length of the second via V2 and a length of the third via V3. That is, the first via V1 overlaps with the conductive layer CL.

As the configuration of the first via V1, a known configuration adopted as a via in the semiconductor technology can be adopted. The first via V1 includes, for example, a barrier film and a conductive film formed on the barrier film. Examples of material of the barrier film include titanium (Ti) and titanium nitride (TiN). The material of the conductive film is, for example, tungsten (W), aluminum (Al), or copper (Cu).

The second via V2 is formed in the interlayer insulating layer IIL such that the second via V2 reaches the first portion P1 of the first slab portion SLB1 (the second slab portion SLB2). That is, the second via V2 overlaps with the first portion P1. In present embodiment, in the thickness direction of the interlayer insulating layer IIL, the length of the second via V2 is greater than the length of the first via V1 and the length of the third via V3. An example of the of the Second via V2 is similar to the First via V1.

The second via V2 is closer to the first via V1 than the third via V3 in the width direction of the optical waveguide OW. This makes it easier to remove charges thermally generated in the optical waveguide OW through the first portion P1 and the second via V2, as compared with when the second via V2 is closer to the third via V3 than the first via V1.

The third via V3 is formed in the interlayer insulating layer IIL such that the third via V3 reaches the second portion P2 of the first slab portion SLB1 (the second slab portion SLB2). That is, the third via V3 overlaps with the second portion P2. An example of the of the third via V3 is similar to the first via V1.

[Operation of Optical Modulator]

Next, the operation of the optical modulator OM will be described. Here, the relationship between the capacitance Cgb and the driving voltage Vgb in the optical modulator OM will be described. Here, the capacitance Cgb is a capacitance of a capacitor composed of the optical waveguide OW, the second insulating layer IL2, and the conductive layer CL. The driving voltage Vgb is a difference (Vg−Vb) between the voltage Vb applied to the second portion P2 of the first slab portion SLB1 (the second slab portion SLB2) and the voltage Vg applied to the conductive layer.

It is assumed that a conductivity type of the impurity contained in the optical waveguide OW, the second portion P2 and the third portion P3 of the first slab portion SLB1 (the second slab portion SLB2), and the conductive layer CL is n-type. It is assumed that a conductivity type of the impurity contained in the first portion P1 of the first slab portion SLB1 (the second slab portion SLB2) is p-type.

1. Comparative Optical Modulator

Figure 3:
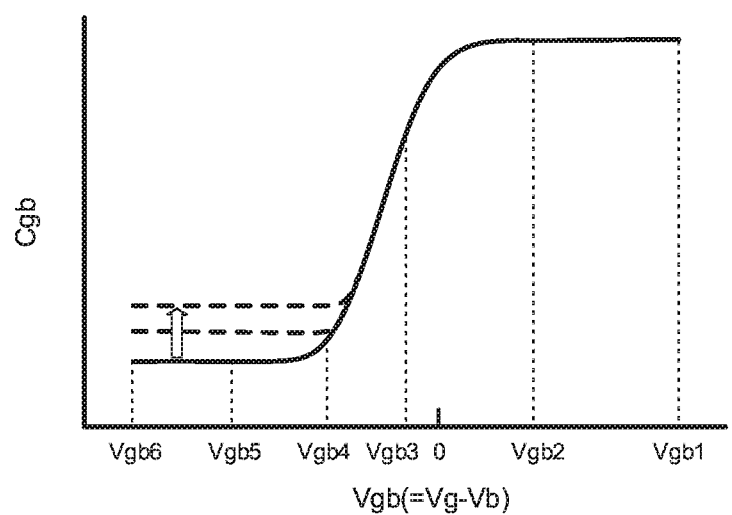
FIG. 3 is a graph of capacitance versus drive voltage in a comparative optical modulator.

First, for comparison, the operation of the optical modulator rOM (hereinafter also referred to as "comparative optical modulator") that does not include the first portion P1 will be described. FIG. 3 is a graph showing the relationship between the capacitance Cgb and the driving voltage Vgb in the comparative optical modulator rOM. FIGS. 4 to 9 are cross-sectional view showing the distributions of charges in the optical modulator rOM during operation of the comparative optical modulator rOM. In FIGS. 4 to 9, a black circle indicates a hole, and a white circle indicates an electronic.

Figure 4:
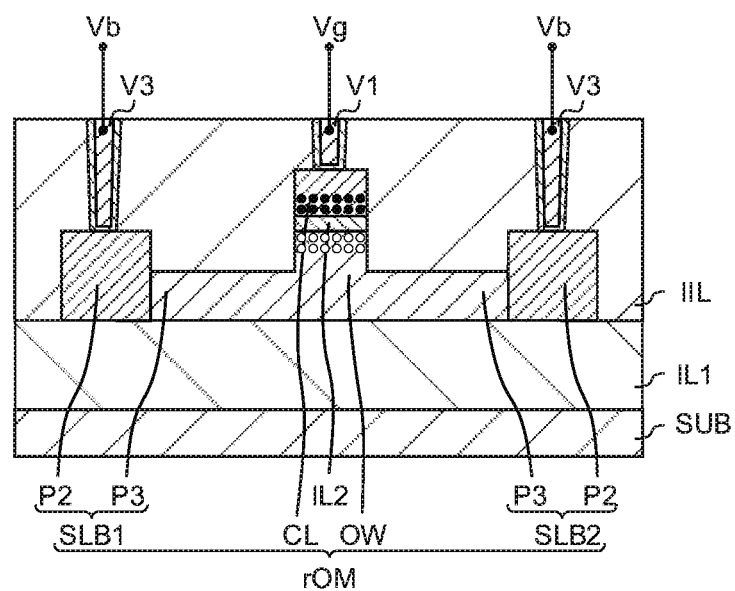
FIG. 4 is a cross-sectional view showing distributions of charges in the optical modulator during operation of the comparative optical modulator.

When a positive driving voltage Vgb1 (Vgb1>0) is applied to the conductive layer CL, holes are accumulated in the conductive layer CL. As shown in FIG. 4, electrons are induced in the optical waveguide OW by the holes. At this time, the capacitance Cgb is determined in accordance with the thickness of the second insulating layer IL2.

Figure 5:
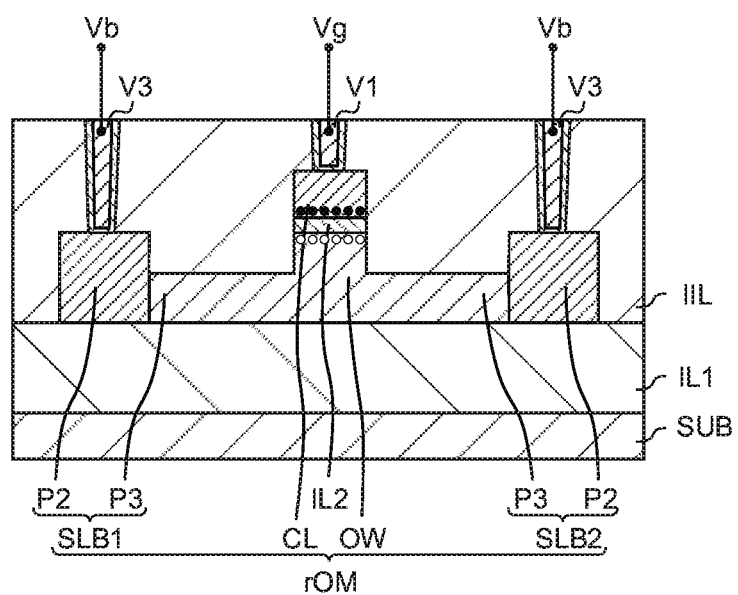
FIG. 5 is a cross-sectional view showing distributions of charges in the optical modulator during operation of the comparative optical modulator.

When a driving voltage Vgb2 (Vgb2<Vgb1) smaller than the driving voltage Vgb1 is applied to the conductive layer CL, the number of holes accumulated in the conductive layer CL is reduced as compared with the number of holes accumulated in the conductive layer CL when the driving voltage Vgb1 is applied to the conductive layer CL. This also reduces the number of electrons induced in the optical waveguide OW, as shown in FIG. 5. Also, in this case, the capacitance Cgb is determined in accordance with the thickness of the second insulating layer IL2.

Figure 6:
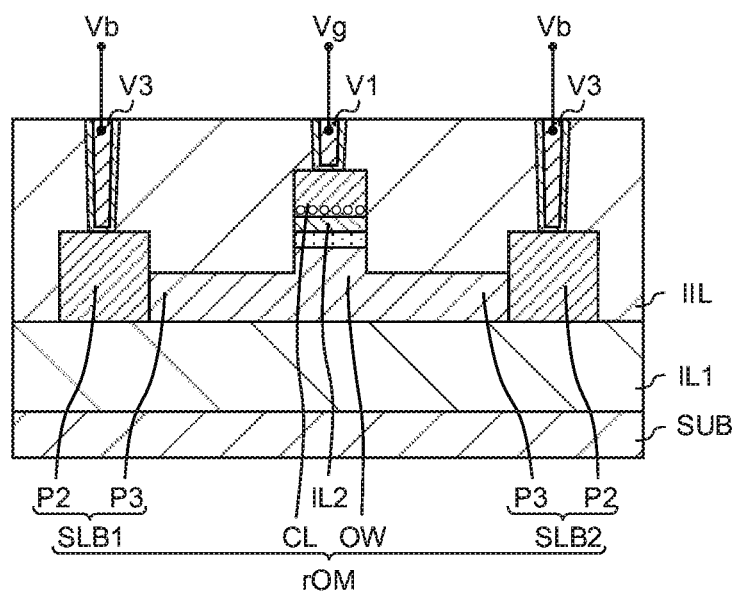
FIG. 6 is a cross-sectional view showing distributions of charges in the optical modulator during operation of the comparative optical modulator.

When a negative drive voltage Vgb3 (Vgb3<0) is applied to the conductive layer CL, electrons are accumulated in the conductive layer CL. As shown in FIG. 6, electrons in the optical waveguide OW are removed from the optical waveguide OW via the third portion P3 and the second portion P2 by the repulsion force caused by the electrons. As a result, a depletion layer is formed in the optical waveguide OW. The depletion layer is a portion indicated by a crepe pattern in FIG. 6. The capacitance Cgb is determined in accordance with a sum of the thickness of the second insulating layer IL2 and a thickness of the depletion layer. Overall, the capacitance Cgb decreases.

Figure 7:
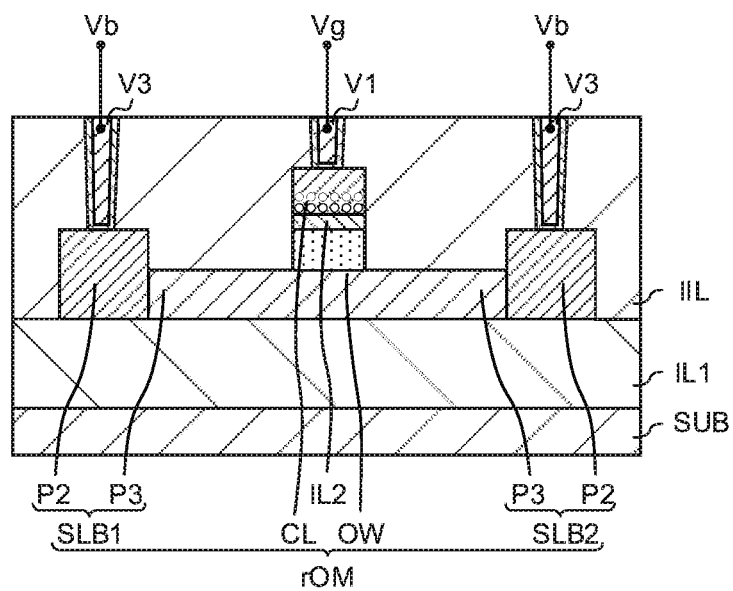
FIG. 7 is a cross-sectional view showing distributions of charges in the optical modulator during operation of the comparative optical modulator.

When the drive voltage Vgb4 (Vgb4<Vgb3) smaller than the drive voltage Vgb3 is applied to the conductive layer CL, the thickness of the depletion layer formed in the conductive layer CL is increased as shown in FIG. 7 as compared with the case where the drive voltage Vgb3 is applied to the conductive layer CL. As a result, the capacitance Cgb is further reduced.

Figure 8:
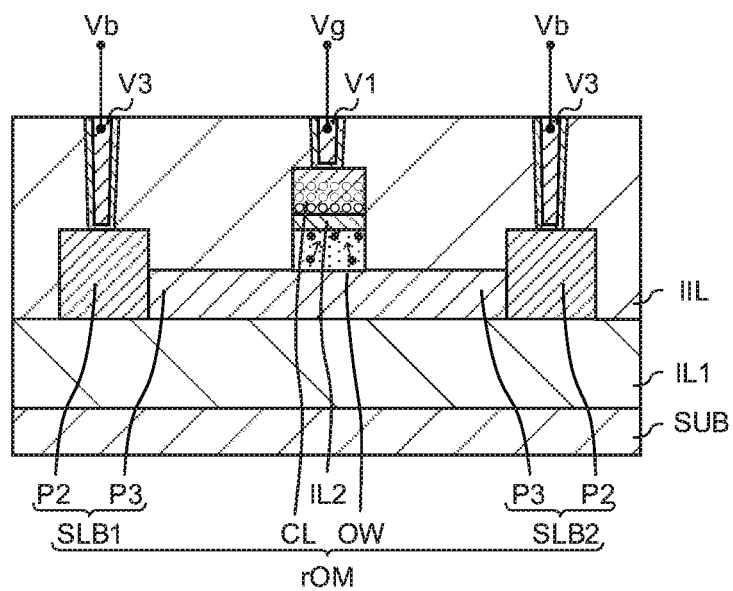
FIG. 8 is a cross-sectional view showing distributions of charges in the optical modulator during operation of the comparative optical modulator.

When a driving voltage Vgb5 smaller than a predetermined value is applied to the conductive layer CL, electron-hole pairs begin to be thermally formed in the optical waveguide OW. For example, the predetermined value is about twice the built-in voltage between the optical waveguide OW (n-type silicon layer) and the intrinsic semiconductor (silicon layer) of the material constituting the optical waveguide OW. As a result, as shown in FIG. 8, holes in the electron-hole pairs are accumulated on a lower surface of the second insulating layer IL2 by an electric field formed between the conductive layer CL and the optical waveguide OW, thereby forming an inversion layer. The number of holes in the inversion layer increases exponentially as the driving voltage Vgb decreases. As a result, in the optical waveguide OW, the width of the depletion layer located under the inversion layer is substantially unchanged. As a result, the capacitance Cgb is also substantially constant (fixed and unchanged), as indicated the solid line in FIG. 3.

Figure 9:
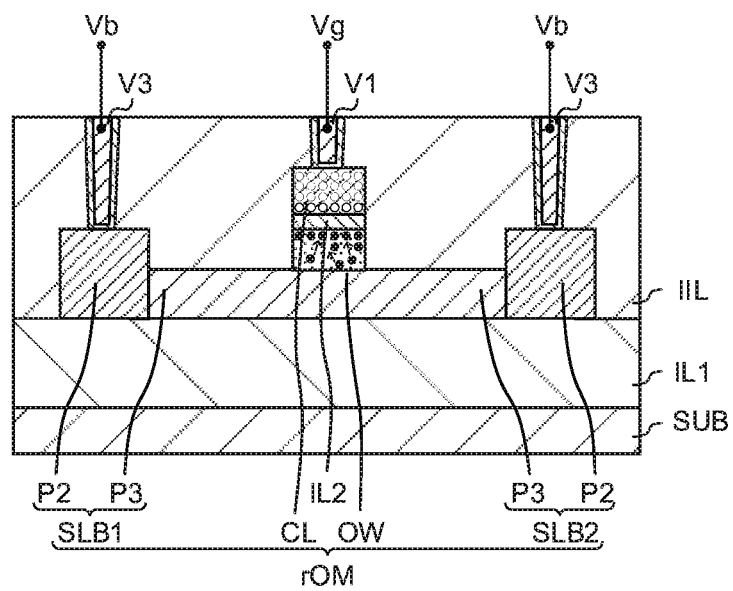
FIG. 9 is a cross-sectional view showing distributions of charges in the optical modulator during operation of the comparative optical modulator.

Further, when a driving voltage Vgb6 (Vgb6<Vgb5) smaller than the driving voltage Vgb5 is applied to the conductive layer CL, the electron-hole pairs in the optical waveguide OW exponentially increases as shown in FIG. 9, as compared with the case where the driving voltage Vgb5 is applied to the conductive layer CL. Therefore, in the inversion layer, the number of holes derived from the electron-hole pairs continues to increase until the thermal equilibrium state is reached. As a result, in the comparative optical modulator rOM, the capacitance Cgb increases until the thermal equilibrium is reached, as indicated by the broken line in FIG. 3.

Therefore, the comparative optical modulator rOM cannot adequately modulate the light until thermal equilibrium is reached. In the comparative optical modulator rOM, it is preferable to modulate the light after the thermal equilibrium has been reached. That is, the optical modulator rOM has a low following property with respect to the driving voltage Vgb. the comparative optical modulator rOM is not suitable for high speed operation.

2. Optical Modulator According to Present Embodiment

Figure 10:
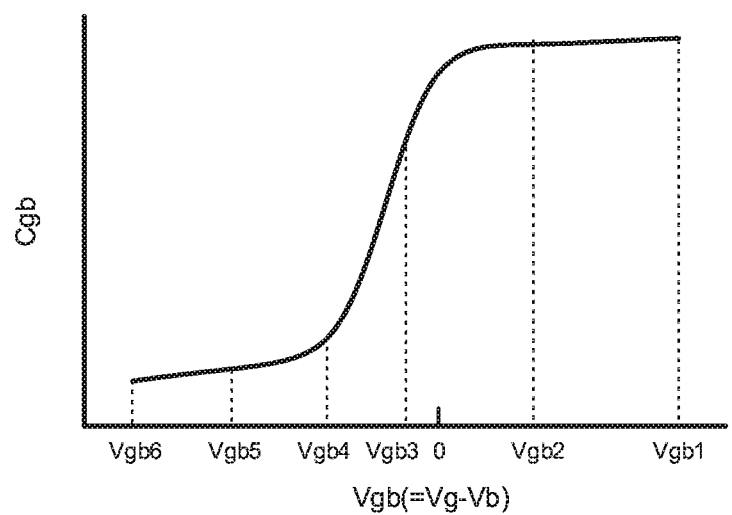
FIG. 10 is a graph of capacitance versus drive voltage in the optical modulator according to the embodiment.
Figure 11:
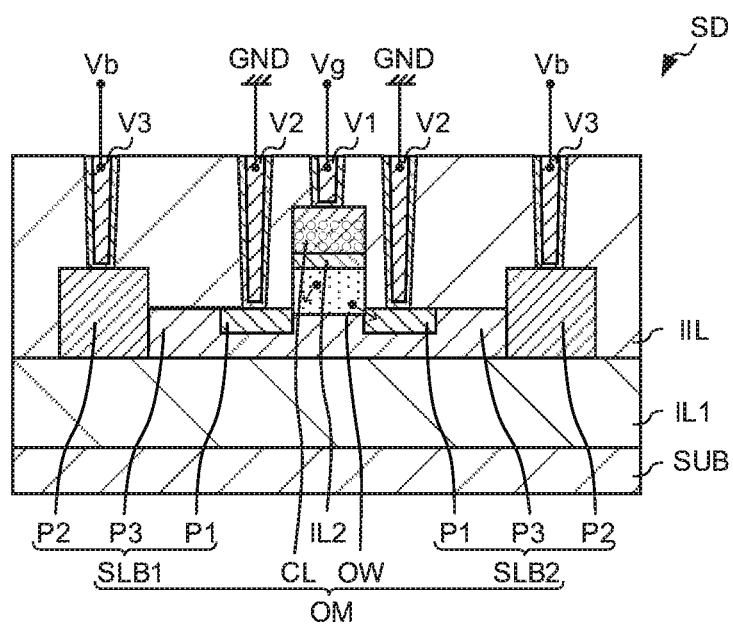
FIG. 11 is a cross-sectional view showing distributions of charges in the optical modulator during operation of the optical modulator according to the embodiment.
Figure 12:
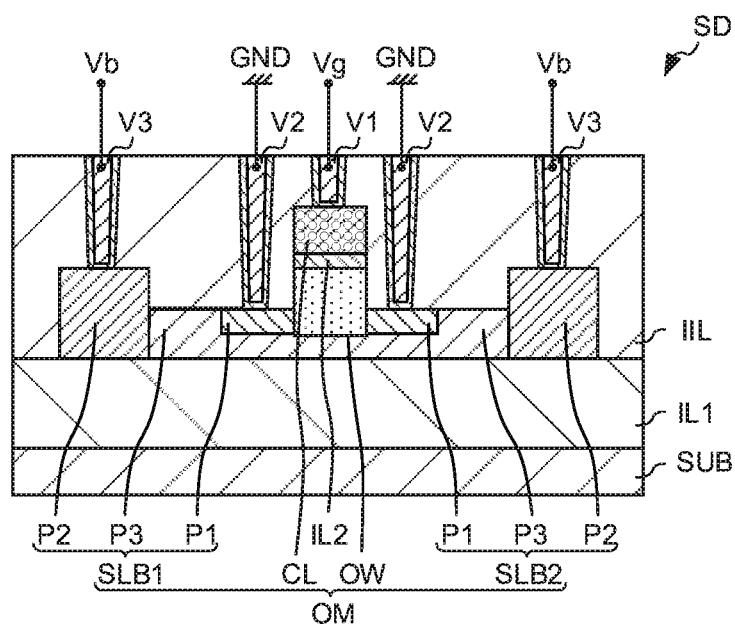
FIG. 12 is a cross-sectional view showing distributions of charges in the optical modulator during operation of the optical modulator according to the embodiment.

Next, the operation of the optical modulator OM according to the present embodiment will be described. FIG. 10 is a graph showing the relationship between the capacitance Cgb and the driving voltage Vgb in the optical modulator OM according to the present embodiment. FIG. 11 and FIG. 12 are cross-sectional view showing the distributions of charges in the optical modulator OM during the operation of the optical modulator OM according to the present embodiment. In FIG. 11 and FIG. 12, a black circle indicates a hole, and a white circle indicates an electronic.

When the drive voltage Vgb applied to the conductive layer CL is Vgb1, Vgb2, Vgb3 or Vgb4, the charge distribution in the optical modulator OM is similar to the charge distribution in the comparative optical modulator rOM (see FIGS. 4 to 7). Therefore, the description thereof is omitted.

When the driving voltage Vgb5 smaller than a predetermined value is applied to the conductive layer CL, electron-hole pairs begin to be thermally formed in the optical waveguide OW. In present embodiment, grounding potential is supplied to the first portion P1 of the first slab portion SLB1 (the second slab portion SLB2). Therefore, as shown in FIG. 11, holes of electron-hole pairs generated in the optical waveguide OW are removed from the optical waveguide OW via the first portion P1. The electrons of the electron-hole pairs are removed from the optical waveguide OW through the third portion P3 and the second portion P2. Therefore, in the comparative optical modulator rOM, the inversion layer is formed on the lower surface of the second insulating layer IL2, whereas in the optical modulator OM according to present embodiment, the inversion layer is suppressed from being formed.

Further, even if the driving voltage Vgb6 (Vgb6<Vgb5) smaller than the driving voltage Vgb5 is applied to the conductive layer CL, holes of electron-hole pairs generated in the optical waveguide OW are removed through the first portion P1, as shown in FIG. 11. In present embodiment, since the inversion layer is not formed, the thickness of the depletion layer is gradually increased. As a result, the capacitance Cgb gradually decreases from the drive voltage Vgb5 toward the drive voltage Vgb6.

As described above, even in the optical waveguide OW, although the electron-hole pairs are generated, the holes are removed through the first portion P1. Therefore, in the optical modulator OM, even in a state in which electron-hole pairs are generated, the electron-hole pairs can be regarded as reaching a substantially thermal equilibrium state. That is, as compared with the comparative optical modulator rOM, in the optical modulator OM according to present embodiment, the capacitance Cgb is suppressed from increasing. As a result, the optical modulator OM has following property with respect to the driving voltage Vgb and is suitable for high-speed operation.

[Method of Manufacturing Semiconductor Device]

Next, an exemplary method of manufacturing the semiconductor device SD according to present embodiment will be described. FIGS. 13 to 20 are a cross-sectional view showing examples of steps included in the method of manufacturing the semiconductor device SD.

The method of manufacturing the semiconductor device SD includes, for example, (1) a step of providing the semiconductor wafer SW, (2) a step of forming the second insulating layer IL2, (3) a step of forming the conductive layer CL, (4) a patterning step, (5) a first ion implantation step, (6) a second ion implantation step, and (7) a step of forming the wiring layer WL.

(1) Providing of the Semiconductor Wafer SW

Figure 13:
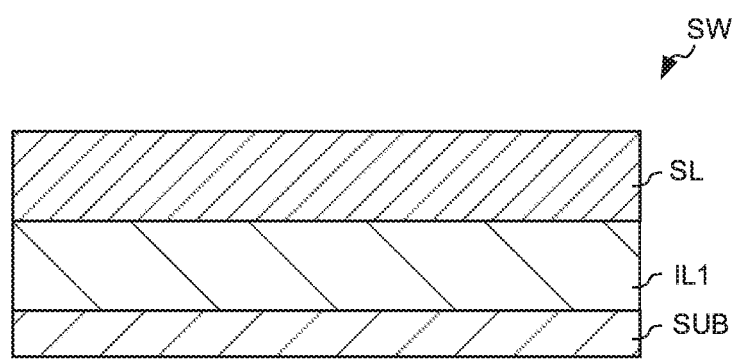
FIG. 13 is a cross-sectional view showing an exemplary step included in the method of manufacturing the semiconductor device according to the embodiment.

First, as shown in FIG. 13, the semiconductor wafer SW having the substrate SUB, the first insulating layer IL1 formed on the substrate SUB, and a semiconductor layer SL formed on the first insulating layer IL1 is provided.

The semiconductor wafer SW may be manufactured or purchased as a commercial product. The semiconductor wafer SW is, for example, a Silicon On Insulator (SOI) substrate. The method of manufacturing SOI substrate can be appropriately selected from a known manufacturing method. Examples of manufacturing SOI substrate include Separation by Implantation of Oxygen (SIMOX) method and smart-cut method. Next, impurities having a desired impurity concentration is implanted into the semiconductor layer SL by an ion implantation technique.

Examples of materials of substrate SUB and impurity are described above. Examples of material for the semiconductor layer SL include silicon and germanium. The crystal structure of the material of the semiconductor layer SL may be single crystal or polycrystalline. The semiconductor layer SL has the first conductivity type.

(2) Forming of the Second Insulating Layer IL2

Figure 14:
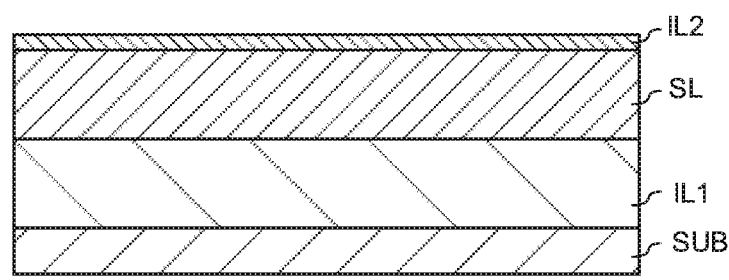
FIG. 14 is a cross-sectional view showing an exemplary step included in the method of manufacturing the semiconductor device according to the embodiment.

Next, as shown in FIG. 14, the second insulating layer IL2 is formed on the semiconductor layer SL. Examples of the method of forming the second insulating layer IL2 include a CVD method and a thermal oxidization method.

(3) Formation of the Conductive Layer CL

Figure 15:
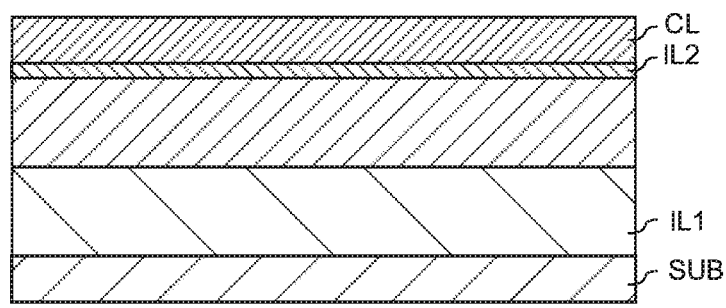
FIG. 15 is a cross-sectional view showing an exemplary step included in the method of manufacturing the semiconductor device according to the embodiment.

Next, as shown in FIG. 15, the conductive layer CL is formed on the second insulating layer IL2. The conductive layer CL is formed by, for example, a sputtering method.

(4) Patterning

Figure 16:
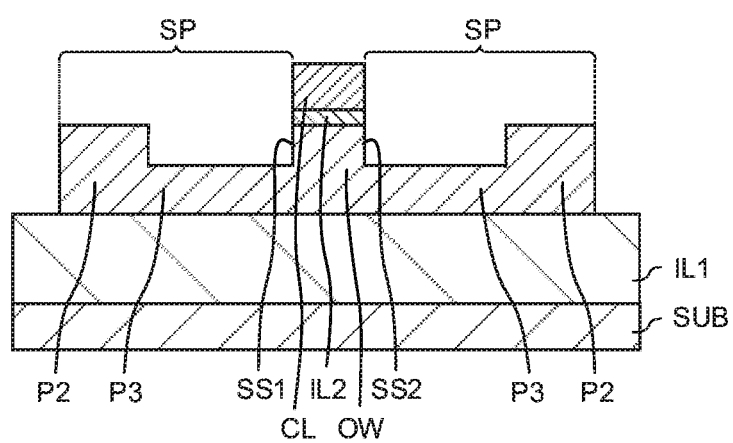
FIG. 16 is a cross-sectional view showing an exemplary step included in the method of manufacturing the semiconductor device according to the embodiment.

Next, as shown in FIG. 16, the semiconductor layer SL, the second insulating layer IL2, and the conductive layer CL are patterned to form the optical waveguide OW and a pair of semiconductor portions SP. The optical waveguide OW and the pair of semiconductor portions SP are formed with each other as a single member. One semiconductor portion SP is adjacent to the first side surface SS1 of the optical waveguide OW, and the other semiconductor portion SP is adjacent to the second side surface SS2 of the optical waveguide OW. In the present embodiment, the semiconductor portion SP includes the optical waveguide OW, the second portion P2 (protruding portion) spaced apart from the optical waveguide OW, and the third portion P3 formed between the second portion P2 and the optical waveguide OW.

In this step, the conductive layer CL and the second insulating layer IL2 are removed in a region other than the region where the optical waveguide OW is formed, and the semiconductor layer SL is patterned into a desired shape. In particular, the third portion P3 is formed by patterning the semiconductor layer SL such that a portion of the semiconductor layer SL remains in the thickness direction of the semiconductor layer SL. The patterning of the semiconductor layer SL can be performed by photolithography and etching techniques.

(5) First Ion Implantation

Figure 17:
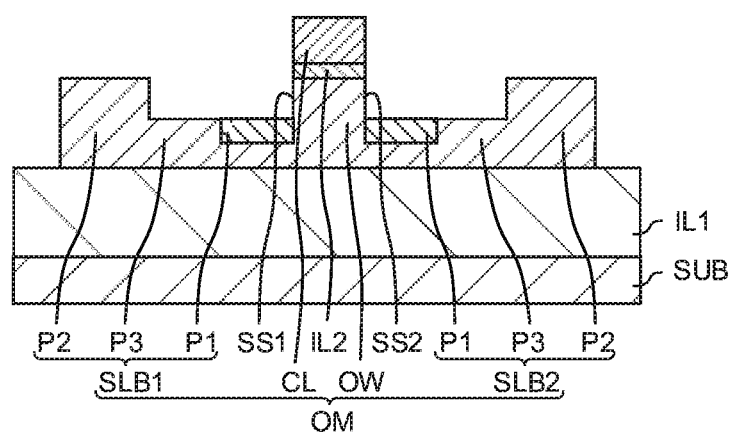
FIG. 17 is a cross-sectional view showing an exemplary step included in the method of manufacturing the semiconductor device according to the embodiment.

Next, as shown in FIG. 17, impurities of the second conductivity type which differs from the first conductivity type are implanted into a portion of the semiconductor portion SP (the third portion P3) by an ion implantation method. As a result, the portion into which the impurities of the second conductivity type are implanted becomes the first portion P1. Thus, the first slab portion SLB1 and the second slab portion SLB2 are formed. As a result, optical modulator OM is formed.

(6) Second Ion Implantation

Figure 18:
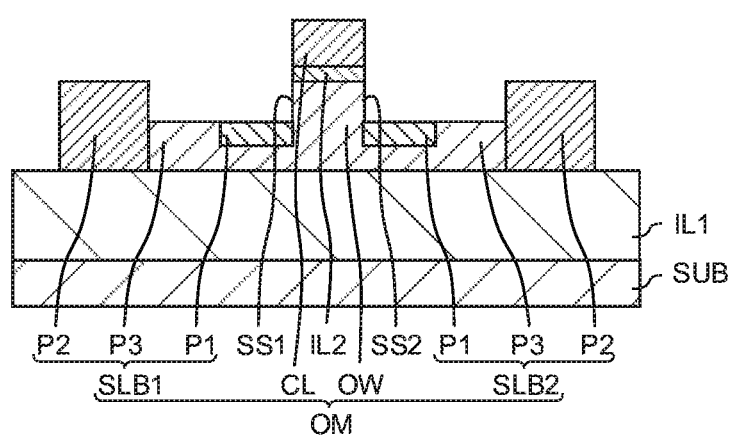
FIG. 18 is a cross-sectional view showing an exemplary step included in the method of manufacturing the semiconductor device according to the embodiment.

Next, as shown in FIG. 18, the impurity of the first conductivity type are implanted into portions of the first slab portion SLB1 and the second slab portion SLB2 located farther from the optical waveguide OW than the first portion P1 by the ion implantation method. Specifically, the impurity of the first conductivity type are implanted into the second portion P2. As a result, the impurity concentration of the second portion P2 becomes greater than the impurity concentration of the optical waveguide OW.

(7) Forming wiring layer WL

Next, wiring layers WL is formed. As a method of forming the wiring layer WL, a method known as a method of forming multilayer wiring layer in the semiconductor technology can be employed.

Figure 19:
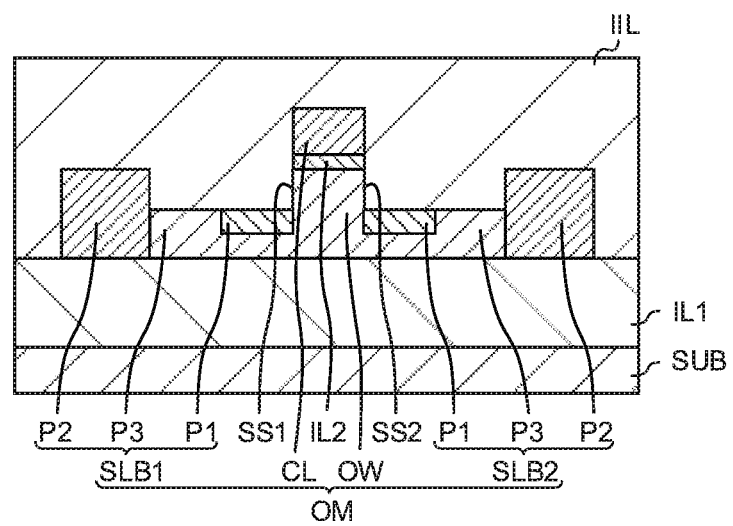
FIG. 19 is a cross-sectional view showing an exemplary step included in the method of manufacturing the semiconductor device according to the embodiment.

First, as shown in FIG. 19, an interlayer insulating layer IIL is formed on the first insulating layer IL1 so as to cover the optical waveguide OW, the first slab portion SLB1, the second slab portion SLB2, the second insulating layer IL2, and the conductive layer CL. The interlayer insulating layer IIL is formed by, for example, CVD method.

Figure 20:
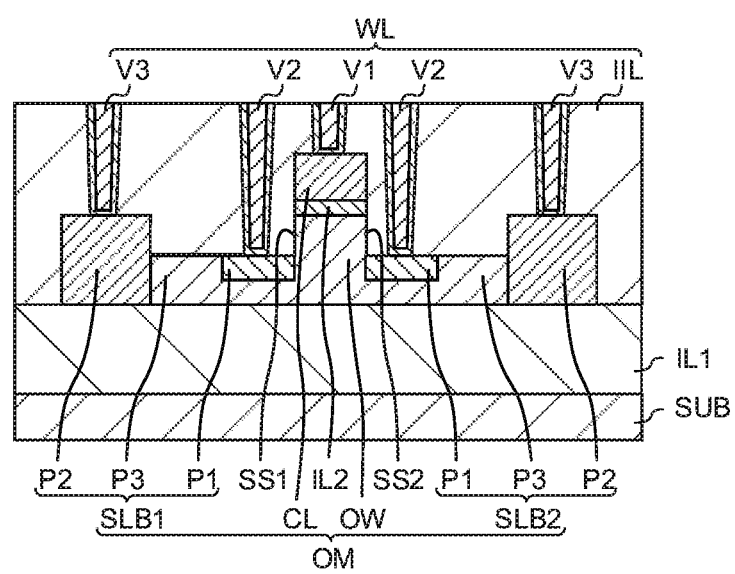
FIG. 20 is a cross-sectional view showing an exemplary step included in the method of manufacturing the semiconductor device according to the embodiment.

Next, as shown in FIG. 20, the first via V1, the second via V2, and the third via V3 are formed in the interlayer insulating layer IIL. The first via V1 is formed so as to reach the conductive layer CL. The second vias V2 are formed so as to reach the first portion P1 of the first slab portion SLB1 (the second slab portion SLB2). The third vias V3 are formed so as to reach the second portion P2 of the first slab portion SLB1 (the second slab portion SLB2). Each of the first via V1, the second vias V2, and the third vias V3 is formed, for example, by forming a through hole in the interlayer insulating layer IIL and then burying the through hole with a conductive material.

Finally, a plurality of singulated semiconductor devices SD is obtained by dicing the semiconductor wafer SW and the wiring layers WL.

[Effect]

The optical modulator OM of the semiconductor device SD according to present embodiment includes the first slab portion SLB1 on which the first portion P1 is formed; and the second slab portion SLB2 on which the first portion P1 is formed. As a result, when the optical modulator OM is driven, charges (holes in the present embodiment) derived from electron-hole pairs thermally generated in the optical waveguide OW are removed through the first portion P1. As a result, the variation of the capacitance $C_{gb}$ caused by the carrier is suppressed. As a result, the optical modulator OM has a high following property with respect to the driving voltage $V_{gb}$ and can cope with a high-speed operation. According to the present embodiment, the characteristics of the semiconductor device SD can be enhanced.

[First Modification]

Figure 21:
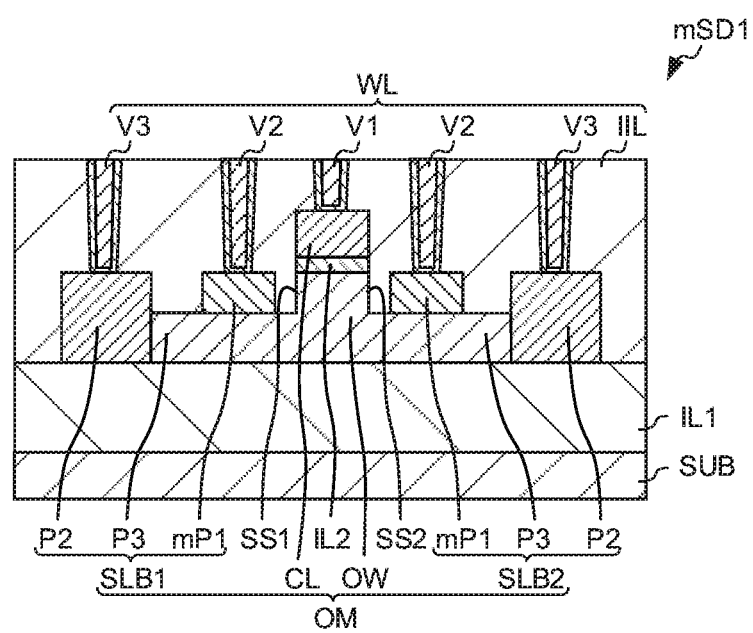
FIG. 21 is a cross-sectional view showing an exemplary configuration of a main portion of a semiconductor device according to a first modification of the embodiment.

FIG. 21 is a cross-sectional view showing an exemplary configuration of a main portion of a semiconductor device mSD1 according to the first modification of the present embodiment. As shown in FIG. 21, in the semiconductor device mSD1 according to the first modification, each of the first slab portion SLB1 and the second slab portion SLB2 has a protrusion formed between the optical waveguide OW and the second portion P2. In the first modification, the first portion mP1 is formed in the protrusion. In the first modification, the distance between an upper surface of a first portion mP1 and the upper surface of the first insulating layer IL1 is about the same as the height of the optical waveguide OW. The height of the second via V2 is approximately the same as the height of the third via V3.

[Second Modification]

Figure 22:
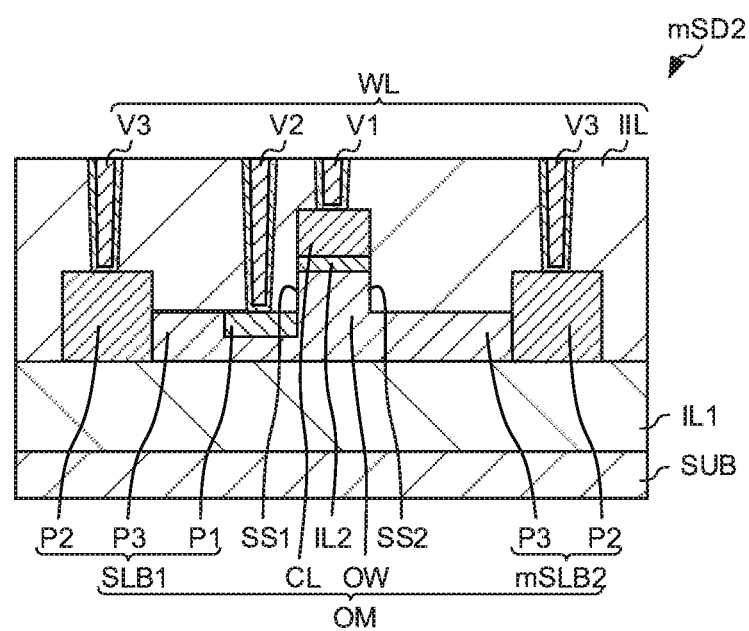
FIG. 22 is a cross-sectional view showing an exemplary configuration of a main portion of a semiconductor device according to a second modification of the embodiment.

FIG. 22 is a cross-sectional view showing an exemplary configuration of a main portion of a semiconductor device mSD2 according to the second modification of present embodiment. As shown in FIG. 22, in the semiconductor device mSD2 according to the second modification, the first slab portion SLB1 includes the first portion P1 and the second slab portion mSLB2 does not include first portion P1. That is, the second slab portion mSLB2 does not include a portion having the second conductivity type.

[Third Modification]

Figure 23:
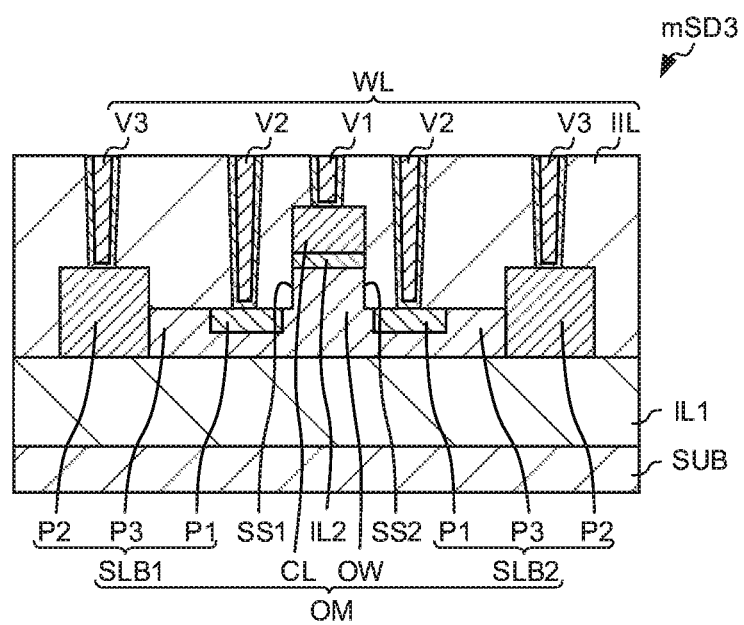
FIG. 23 is a cross-sectional view showing an exemplary configuration of a main portion of a semiconductor device according to a third modification of the embodiment.

FIG. 23 is a cross-sectional view showing an exemplary configuration of a main portion of a semiconductor device mSD3 according to third modification of present embodiment. As shown in FIG. 23, in the semiconductor device mSD3 according to the third modification, the first portion P1 formed in the first slab portion SLB1 (the second slab portion SLB2) is spaced apart from the optical waveguide OW. More specifically, the first portion P1 of the first slab portion SLB1 is spaced apart from the first side surface SS1 of the optical waveguide OW, and the first portion P1 of the second slab portion SLB2 is spaced apart from the second side surface SS2 of the optical waveguide OW.

[Fourth Modification]

Figure 24:
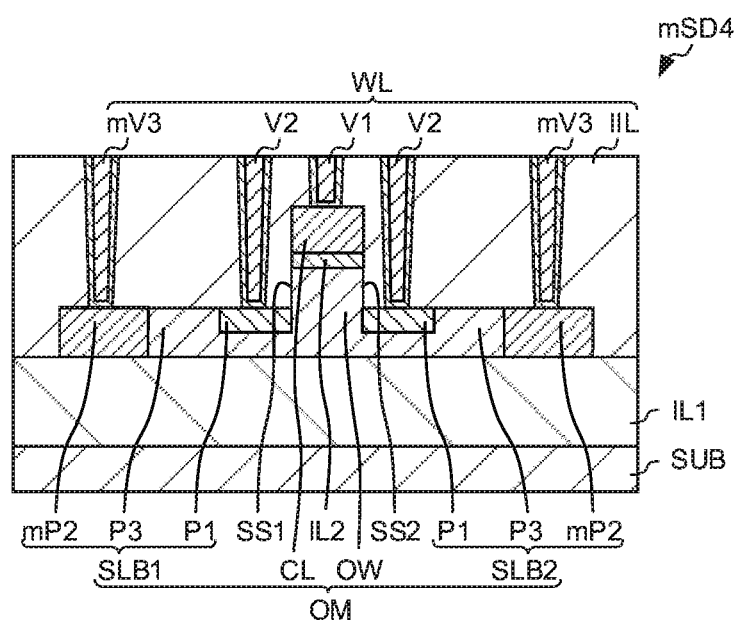
FIG. 24 is a cross-sectional view showing an exemplary configuration of a main portion of a semiconductor device according to a fourth modification of the embodiment.

FIG. 24 is a cross-sectional view showing an exemplary configuration of a main portion of a semiconductor device mSD4 according to the fourth modification of present embodiment. As shown in FIG. 24, in the semiconductor device mSD4 according to the fourth modification, a second portion mP2 formed in the first slab portion SLB1 (the second slab portion SLB2) does not protrude. In other words, the distance between an upper surface of the second portion mP2 and the upper surface of the first insulating layer IL1 is about the same as the distance between the upper surface of the first portion P1 and the upper surface of the first insulating layer IL1. A height of the third via mV3 is approximately the same as the height of the second via V2.

It should be noted that the present invention is not limited to the above-mentioned embodiments, and various modifications can be made without departing from the gist thereof. For example, the wiring layer WL may further include other layer between layers of the wiring layer WL. Examples of the other layer include a silicon nitride film. The wiring of the wiring layer WL may have so-called damascene structures. Furthermore, the optical waveguide OW may have a size of the micrometer order.

In the above embodiment, each of the first slab portion SLB1 and the second slab portion SLB2 include the first portion P1, the second portion P2, and the third portion P3. However, depending on the desired properties, one or both of the first slab portion SLB1 and the second slab portion SLB2 may further comprise a fourth portion. For example, the fourth portion may be a semiconducting layer formed between the first portion P1 and the second portion P2 and having the same conductivity type as the third portion P3. The impurity concentration of the fourth portion is preferably the same as or greater than the impurity concentration of the third portion P3 and the same as or smaller than the impurity concentration of the second portion P2. The impurity concentration of the fourth portion is preferably, for example, $1 \times 10^{18}$ cm$^{-3}$ or more and $1 \times 10^{20}$ cm$^{-3}$ or less.

In addition, even when a specific numerical value example is described, it may be a numerical value exceeding the specific numerical value, or may be a numerical value less than the specific numerical value, except when it is theoretically obviously limited to the numerical value. In addition, the component means "B containing A as a main component" or the like, and the mode containing other components is not excluded.

Further, at least a part of the embodiment and at least a part of each modification may be arbitrarily combined with each other. For example, the configuration of the first slab portion SLB1 (the second slab portion SLB2) may be appropriately designed.

What is claimed is:

1. A semiconductor device comprising:
a first insulating layer;
an optical waveguide formed on the first insulating layer and having a first side surface and a second side surface which are located opposite sides with each other;
a first slab portion formed on the first insulating layer such that the first slab portion is adjacent to the first side surface;
a second insulating layer formed on the optical waveguide; and
a conductive layer formed on the second insulating layer,
wherein the optical waveguide has a first conductivity type,
wherein the first slab portion comprises;
   a first portion having a second conductivity type opposite to the first conductivity type;
   a second portion located farther from the optical waveguide than the first portion and having the first conductivity type; and
   a third portion formed between the optical waveguide and the second portion and having the first conductivity type,
wherein the semiconductor device further comprises:
   an interlayer insulating layer formed on the first insulating layer such that the interlayer insulating layer covers the optical waveguide, the first slab portion, the second insulating layer, and the conductive layer;
   a first via formed in the interlayer insulating layer such that the first via reaches the conductive layer;
   a second via formed in the interlayer insulating layer such that the second via reaches the first portion; and
   a third via formed in the interlayer insulating layer such that the third via reaches the second portion.

2. The semiconductor device according to claim 1, wherein the first portion is configured to allow grounding potential to be supplied through the second via.

3. The semiconductor device according to claim 1, wherein the second via is closer to the first via than the third via in opposite direction of the first side surface and the second side.

4. The semiconductor device according to claim 1, wherein the optical waveguide, the first slab portion, the second insulating layer, and the conductive layer are configured to modulate phase of light passing in the optical waveguide.

5. The semiconductor device according to claim 1,
wherein, in a thickness direction of the interlayer insulating layer, a length of the first via is smaller than a length of the second via, and
wherein, in the thickness direction of the interlayer insulating layer, the length of the second via is greater than a length of the third via.

6. The semiconductor device according to claim 1,
wherein, in a thickness direction of the interlayer insulating layer, a length of the first via is smaller than a length of the second via and a length of the third via.

7. The semiconductor device according to claim 1, wherein an impurity concentration of the first portion is greater than an impurity concentration of the optical waveguide.

8. The semiconductor device according to claim 7, wherein an impurity concentration of the second portion is greater than an impurity concentration of the optical waveguide.

9. The semiconductor device according to claim 1, wherein the first portion is spaced apart from the optical waveguide.

10. The semiconductor device according to claim 1, comprising a second slab portion formed on the first insulating layer such that the second slab portion is adjacent to the second side surface,
wherein the second slab portion comprises:
a fourth portion having the second conductivity type;
a fifth portion located farther from the optical waveguide than the first portion and having the first conductivity type; and
a sixth portion formed between the optical waveguide and the second portion and having the first conductivity type.

11. The semiconductor device according to claim 10, wherein the interlayer insulating layer covers the second slab portion, and
wherein the semiconductor device comprises:
a fourth via formed in the interlayer insulating layer such that the fourth via reaches the fourth portion; and
a fifth via formed in the interlayer insulating layer such that the fifth via reaches the fifth portion.

12. The semiconductor device according to claim 1, comprising a second slab portion formed on the first insulating layer such that the second slab portion is adjacent to the second side surface,
wherein the second slab portion does not include a portion having the second conductivity type.

13. The semiconductor device according to claim 1, wherein the first conductivity type is p-type, and
wherein the second conductivity type is n-type.

14. The semiconductor device according to claim 1, wherein the first conductivity type is n-type, and
wherein the second conductivity type is p-type.

* * * * *